United States Patent
Seelert et al.

[11] Patent Number: 5,930,600
[45] Date of Patent: Jul. 27, 1999

[54] DIODE-LASER MODULE WITH A BONDED COMPONENT AND METHOD FOR BONDING SAME

[75] Inventors: Wolf Seelert, Lübeck; Jorg Lawrenz-Stolz, Süsel-Zarnekau; Herry Wilhelm; Kai-Peter Stamer, both of Lübeck, all of Germany

[73] Assignee: Coherent, Inc., Santa Clara, Calif.

[21] Appl. No.: 08/825,006

[22] Filed: Mar. 26, 1997

[30] Foreign Application Priority Data

Apr. 2, 1996 [DE] Germany .................. 196 13 236

[51] Int. Cl.⁶ .................. H01L 21/44; H01L 21/48; H01L 21/50

[52] U.S. Cl. .................. 438/118; 438/106; 438/121; 438/122

[58] Field of Search .................. 438/118, 106, 438/121, 122

[56] References Cited

U.S. PATENT DOCUMENTS 3,600,650  8/1971  Obenhaus et al. .
4,766,409  8/1988  Mandaz .
4,798,439  1/1989  Preston .................. 350/96.2
4,990,987  2/1991  Boucher et al. .

FOREIGN PATENT DOCUMENTS 2 116 630   10/1972  Germany .................. H05K 7/20
42 21 564    1/1994  Germany .................. H01L 21/58
94 05 654 U  6/1997  Germany .................. H05K 3/34

OTHER PUBLICATIONS

Brochure, "PTC Thermistors for Self-Regulating Heaters", by Advanced Thermal Products, Inc., Data Sheet P493, 2 pages in length.

*Primary Examiner*—Kevin M. Picardat
*Assistant Examiner*—Dever Collins
*Attorney, Agent, or Firm*—Limbach & Limbach L.L.P.

[57] ABSTRACT

A method for bonding a component (14) to a substrate (18) via a thermally hardened or softened bonding medium, employs PTC or NTC thermistor (24) for heating the bonding medium during bonding of the component. In one disclosed example, the method is used for bonding an optical fiber to a substrate, via a solder layer (40), in alignment with a semiconductor laser (12) in a diode-laser module (10).

12 Claims, 1 Drawing Sheet

DIODE-LASER MODULE WITH A BONDED COMPONENT AND METHOD FOR BONDING SAME

BACKGROUND OF THE INVENTION

The present invention relates in general to methods of assembling components in a diode-laser module. The invention relates in particular to a diode-laser or semiconductor-laser module including a component bonded to a substrate via a bonding medium, and a heating-element for heating the bonding medium, and to a method for bonding the component to the substrate, whereby the bonding medium is heated by the heating element during bonding of the component.

A module and bonding method of this type are disclosed in European patent publication EP 0 196 875. According to this prior-art process, an optical component in the form of an optical fiber is soldered onto a soldering site on a substrate. The solder is melted by a heating-element previously bonded to the substrate. The heating element is in the form of a chip resistor. A disadvantage of this prior art process is that the temperature to which the soldering site is heated by the chip resistor is difficult to control and can vary considerably over the surface of the chip resistor. Further, in order to reliably solder on a mass production scale by this prior-art method, the soldering site must be heated to a temperature well above the melting point of the solder. Because of this, the component to be soldered may be damaged, and the soldering site can become highly stressed after cooling, which can lead to misalignment or detachment of the component.

SUMMARY OF THE INVENTION

An object of the present invention is to provide a component bonding method which overcomes the disadvantages of the above-discussed prior-art method.

This object of the present invention is accomplished in a method for bonding a component on a substrate whereby a bonding medium is heated during a bonding procedure. The method of the present invention is characterized in that the bonding medium is heated by a positive temperature coefficient resistor or thermistor (PTC-thermistor) which has an essentially constant electrical potential (voltage) applied thereto during bonding of the component, or is heated by a negative temperature coefficient thermistor (NTC-thermistor) which is supplied with an essentially constant electrical current during the bonding procedure.

A significant advantage of the method of the present invention is that when a specific, essentially constant voltage is applied to the PTC-thermistor, or a specific essentially constant electrical current is supplied to the NTC-thermistor, the PTC-thermistor and NTC-thermistors assume a nominal operating temperature which remains within a narrow temperature range, without a necessity for temperature measurement and control systems used to control temperature of resistive heating elements used in prior art methods.

Further, temperature distribution over the surface of the PTC-resistor and NTC-thermistor is very uniform as a result of what is essentially a temperature self-regulating property of PTC and NTC-thermistors. Because of this, unlike in prior art methods, it is not necessary to heat the bonding medium to a temperature well above that temperature which is actually required for bonding. This serves to protect the component to be bonded from damage, and provides that stresses produced during cooling of the bonding medium are sufficiently low that component misalignment rarely occurs on cooling of the bonding medium.

In the characteristic, resistance versus temperature, curve of a PTC-thermistor (often alternately referred to as a PTC-resistor), there is a narrow temperature region in which the resistance increases steeply with increasing temperature. The temperature at the lower boundary of this narrow range is usually defined as the reference or switch temperature. If the PTC-thermistor, surrounded by air, has applied to it, for example, by means of a voltage regulated power supply, an essentially constant nominal potential (which is typically defined in a data sheet provided by the manufacturer of the PTC-thermistor), the PTC-thermistor assumes a temperature about in the middle of the steep portion of the characteristic curve, i.e., in the middle of the narrow temperature region. This temperature is referred to hereinafter as the nominal or nominal operating temperature of the PTC-thermistor, and is a few degrees (for example, up to about 20° C.) above the switch temperature. If more or less heat is dissipated by the PTC-thermistor, the PTC-thermistor assumes respectively an insignificantly higher or lower temperature, and current flowing through the PTC-thermistor respectively rises or falls, while the potential applied thereto remains essentially constant. As long as the PTC-thermistor is operated in the steep part of its characteristic curve, its temperature changes insignificantly, for example ±5° C. to ±20° C., depending on PTC-thermistor type, over a relatively wide range of applied voltage and heat dissipation. The insignificant dependence of temperature on applied potential can be used to match the operating temperature of the PTC-thermistor, by choice of a particular applied potential, exactly to the temperature requirements for a bonding procedure.

In the case of an NTC-thermistor, there is a (nominal temperature) region of its characteristic, resistance v. temperature curve wherein resistance falls steeply with temperature. If an external heat load is applied to such a NTC-thermistor supplied with essentially constant electrical current, for example from a current regulated power supply, the resistance of the NTC-thermistor will fall, causing less power to be dissipated, thereby maintaining the NTC-thermistor at an essentially constant temperature. In the context of this description and appended claims, a PTC-thermistor and an NTC-thermistor may be collectively defined, in view of the above-discussed operating characteristics as a (temperature) self-regulating thermistor. The term "essentially constant", as applied to applied voltage and supplied current, implies constancy consistent with regulation tolerances of commercially available current-regulated or voltage regulated power supplies.

PCT-thermistors are readily available commercially, for example, from the ATP (Advanced Thermal Products) Corporation, of St. Mary's, Pa., USA, and Siemens of Munich, Germany. They are available in a relatively wide range of switching temperatures, for example from about 50° C. to about 190° C., in various resistance values, and in various shapes. NTC-thermistors are available from Thomson-CSF, of St Appolinaire, France. PCT and NTC-thermistors are available from Fenwal Electronics Inc., of Milford, Mass., USA.

The medium used for bonding can be a solder. In this case, a PTC-thermistor or NTC-thermistor is used which has a nominal temperature a few degrees (for example, between about 1° C. and 40° C.) above the melting point of the solder. In this way, it is possible to reliably melt the solder without having to heat a component to an unnecessarily high temperature.

The bonding medium can also be a heat-curing adhesive, such as a one or two-component epoxy resin. Such adhesives cure, i.e., harden, optimally at a particular temperature. In this case, a PTC-thermistor or NTC-thermistor which has a nominal temperature close to, for example, within about ±20° C. of, the optimal curing temperature of the adhesive would be selected.

A thermoplastic material can also be used as a bonding medium. By way of example, this can be in the form of a thin sheet of such material placed between the substrate and a component to be bonded thereto. A PTC-thermistor or NTC-thermistor is selected which had a nominal temperature a few degrees (for example, between about 1° C. and 40° C.) higher than the melting point of the thermoplastic material. During the bonding procedure, the thermoplastic material is melted and adheres the component to the substrate on being cooled.

In the method of the present invention, the general expression "bonding a component to a substrate", as used in this description and in the appended claims, includes bonding the component directly to the substrate using the bonding medium, and bonding the component to the substrate via intermediate layers or intermediate components. In certain arrangements, the bonding medium is not in contact with the component being bonded, but with one or more intermediate components. This can be appreciated by considering descriptions of exemplary arrangements of PTC-thermistors and components on the substrate which are discussed hereinbelow. With appropriate choice of power supply, these arrangements are, of course, equally applicable if an NTC-thermistor is used in place of a PTC thermistor. To avoid unnecessary repetition, descriptions are presented hereinbelow primarily with reference to PTC-thermistors only.

In one arrangement, the PTC-resistor can be attached directly to the substrate, for example, by soldering (with hard or soft solder), by means of thermoplastic material, by gluing, by screwing, or by clamping. The component is then bonded on the side of the PTC-resistor furthest from the substrate. The PTC-resistor can also be attached to the underside of the substrate and the component bonded to the upper side of the substrate, the heat necessary for heating the bonding medium being conducted from the PTC-resistor through the substrate.

In yet another arrangement, it is possible to bond the component, via the bonding medium, directly or with intermediate layers (for example, to improve solderability) to the substrate, by fixing the PTC-resistor on the side of the component furthest from the substrate. In this case, the heat necessary for heating the bonding medium is conducted from the PTC-resistor through the component.

Instead of attaching the PTC-resistor on the component, it is also possible to attach the PTC-resistor to the substrate adjacent the component. There can be several PTC-resistors arranged around the component, or a PTC-resistor can be used which has an aperture therein, the component being arranged in the aperture. In this case, the heat necessary for heating the bonding medium is conducted laterally from the PTC-resistor through the substrate.

The PTC-resistor can be attached to the substrate before carrying out the bonding process, for example by fixing the PTC-resistor to the substrate with a solder having a higher melting point than the solder selected for bonding the component. In this way it is assured that the PTC-resistor will not detach from the substrate during the bonding process.

Alternatively, it is possible to attach the PTC-resistor and the component to the substrate, in one operation, by soldering or gluing, or bonding via a thermoplastic material. The heat necessary for both bonding sites (for example, the PTC-resistor-on-substrate and component-on-PTC-resistor) being provided by the PTC-resistor.

In all of the above-described arrangements it is possible to either bond several components simultaneously with one PTC-resistor, or to bond one component using several PTC-resistors, for example in the case of a very large component. All of the above-described arrangements have a common characteristic that the PTC or NTC-thermistor is, directly or indirectly, in thermal communication with the bonding medium, i.e., a heat-flow path is provided between the bonding medium and the PTC or NTC-resistor.

A voltage-regulated power supply can be connected to the PTC-thermistor (or a current-regulated power supply connected to a NTC-thermistor) via permanently attached wires or busbars, or a temporary connection can be made, for example, by means of contact-probes or clips.

Components which can be attached include, for example, mechanical, electrical, electronic or optical component parts. Examples of optical component parts are: mirrors, lenses, optical fibers, shutters, prisms, polarizers, laser crystals and non-linear crystals.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the invention.

DETAILED DESCRIPTION OF THE INVENTION

Figure 1:
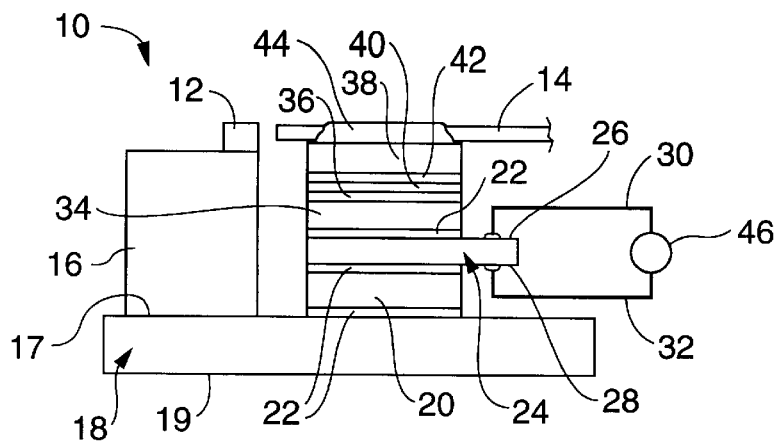
FIG. 1 is an elevation view schematically illustrating a portion of a diode-laser module including an optical fiber bonded to a substrate by the method of the present invention.

Turning now to the drawings, wherein like components are designated by like reference numerals, in FIG. 1, a diode-laser module 10 is illustrated which serves to align output of a semiconductor (diode) laser 12 to an optical fiber 14, which, here, is the component to be bonded. Semiconductor laser 12 is attached to a heat sink 16, which in turn is attached to a flat substrate 18. Substrate 18 may be formed, for example, from a ceramic material. A ceramic plate 20, for thermal isolation purposes, is bonded by an adhesive 22 to substrate 18 adjacent heat sink 16. A PTC-thermistor 24 is attached by an adhesive 22 to ceramic plate 20. PTC-thermistor 24 extends beyond ceramic plate 20, on the right-hand side thereof, in order that on upper and lower surfaces 26 and 28 of the PTC-resistor, electrical lead-wires 30 and 32 respectively can be soldered. On upper surface 30 of PTC-resistor 24 is glued a first support plate 34. The surface of the first support plate facing PTC-thermistor 24 is provided with a solderable metallization layer 36. A second support plate 38 is bonded to metallization layer 36 by solder 40. The solder-facing surface of second support plate 38 is provided with a solderable metallization layer 42. Optical fiber 14 is bonded by an epoxy adhesive 44 to upper surface 46 of second support plate 38.

Epoxy adhesive 44 has a so-called glass temperature, above which it becomes soft. If, during bonding of the fiber, the glass temperature of the epoxy adhesive were exceeded, optical fiber 14 could move on second support plate 38, or even become detached therefrom. The melting point of special soft-solders is between about 10° C. and 40° C. less than the glass temperature of the epoxy adhesive. In this case, the use of PTC-thermistor 24 as a heating element for bonding the component allows the lowest possible soldering temperature to be precisely maintained.

Before bonding optical fiber 14, component parts 12, 16, 18, 20, 24, 30, 32, 34 and 36 are preassembled as a first unit. Component parts 14, 38, 42 and 44 are preassembled as a separate, second unit. For bonding optical fiber 14 in alignment with semiconductor laser 12, the first and second units are bonded together as follows. PTC-thermistor 24 is connected with a power-supply 46 via wires 10 and 11. As discussed above, in the case of a PTC-thermistor, power supply 46 is a voltage regulated power supply for applying a nominally constant voltage. In the case of an NTC-thermistor, power-supply 46 would be a current-regulated power supply for supplying a nominally constant current. After a short warm-up period, PTC-thermistor 24 reaches its nominal temperature and solder 40 is applied to metallization layer 36 of first support plate 34. The solder melts and flows over the metallization layer. Second support plate 38, with optical fiber 14 attached thereto by adhesive layer 44, is placed on the fluid solder. Optical fiber 14 is then optimally aligned with semiconductor laser 12 by measuring light coupled into the fiber. Then, electrical-potential source 46 is removed from the PTC-thermistor, which cools down and solidifies solder 40.

In one example of bonding a fiber by the above-discussed method, PTC-thermistor 24 was a Type Q63100-P390-R200 manufactured by the firm of Siemens, of Munich, Germany. This PTC-thermistor type has a nominal voltage of 24 Volts, a corresponding nominal temperature of about 120° C., and a warm-up time of about ten seconds.

Figure 2:
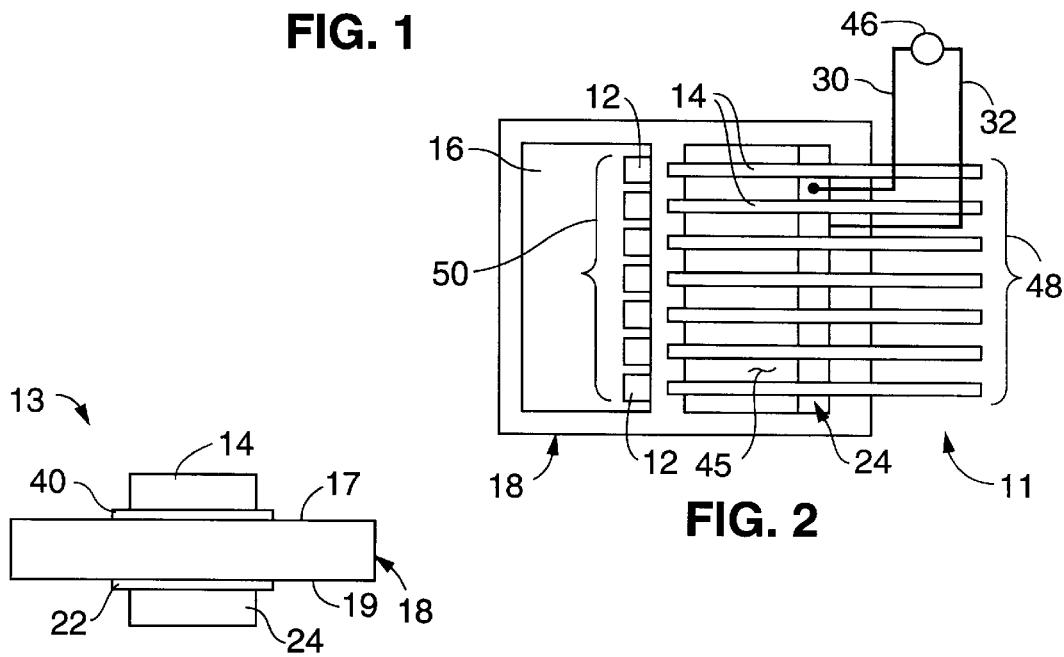
FIG. 2 is a plan view schematically illustrating a portion of a diode-laser module including a side-by-side array of optical fibers bonded to a substrate by the method of the present invention.

Instead of a single optical fiber 14, it is also possible to bond a fiber-array (several fibers arranged side by side), for coupling with a corresponding diode-laser array, by the above-described embodiment of the method of the present invention. This is illustrated in plan view in FIG. 2, wherein a module 11 includes an array 48 of optical fibers 14 aligned with an array 50 of diode-lasers 12.

Figure 3:
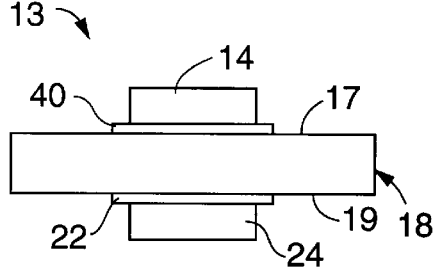
FIG. 3 is an elevation view schematically illustrating an arrangement of a component on an upper side of substrate and a PTC-resistor on an underside of the substrate.

FIG. 3 illustrates an arrangement 13 wherein a PTC-thermistor 24 and component 14 (here shown as any general, electrical, electronic, optical or mechanical component) arranged on opposite sides 17 and 19 of substrate 18. PTC-thermistor 24 is attached to underside 19 of substrate 18, for example, by an adhesive 22. Component 14 is soldered to upper side 17 of substrate 18 by solder 40. Heat necessary for soldering penetrates through substrate 18 from PTC-thermistor 24.

Figure 4:
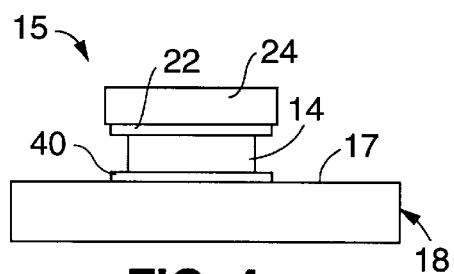
FIG. 4 is an elevation view schematically illustrating an arrangement of a component on a substrate and a PTC-resistor on the component.

FIG. 4 illustrates a further arrangement 15 wherein PTC-thermistor 24 is attached to component 14, for example by an adhesive 22. Component 14 is bonded, on the side thereof opposite the PTC-thermistor, by a solder layer 40 to upper side 17 of substrate 18. Heat from PTC-thermistor necessary for soldering reaches the soldering site, represented by solder layer 40, through substrate 18.

Figure 5:
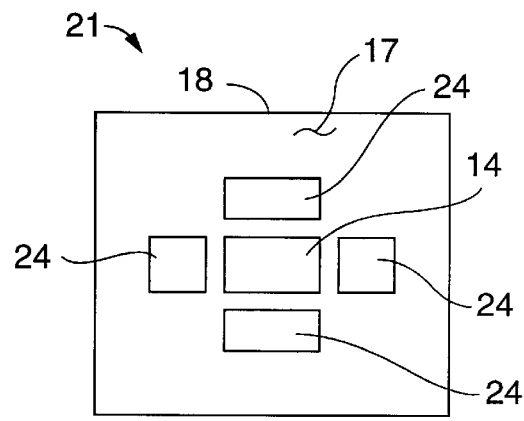
FIG. 5 is an plan view from above view schematically illustrating an arrangement of a plurality of PTC-resistors adjacent a component on a substrate.

In FIG. 5 is shown, in plan view, yet another arrangement 21 wherein a component 14 (here representing a single, large, electrical, electronic, optical or mechanical component) is bonded to substrate 18 at a soldering site thereon (solder layer 40 is not shown). Four PTC-thermistors 24 are attached to substrate 18 adjacent and around component 14. Heat necessary for soldering penetrates laterally through substrate 18 from PTC-thermistors 24.

The arrangements of FIGS. 3, 4, and 5 are discussed with reference to bonding only one component. Those skilled in the art to which the present invention pertains will recognize, however, that these arrangements may also be used for bonding two or more components. As discussed above with reference to FIG. 2.

The present invention has been described and depicted as a preferred and other embodiments. The present invention is not limited, however, to those embodiments described and depicted. Rather, the present invention is limited only by the claims apended hereto.

What is claimed is:

1. A method for bonding a component to a substrate comprising the steps of:
    (a) providing a bonding medium for bonding the component;
    (b) heating the bonding medium using a self-regulating thermistor, said self-regulating thermistor being one of a PTC-thermistor and an NTC-thermistor, and having a nominal operating temperature;
    (c) if said self-regulating thermistor is a PTC-thermistor, applying an essentially constant electrical potential to said PTC-thermistor during said heating of the bonding medium; and
    (d) if said self-regulating thermistor is an NTC-thermistor, supplying said NTC-thermistor with an essentially constant electrical current during said heating of the bonding medium.

2. The method of claim 1, wherein the bonding medium is a solder having a melting temperature, and said nominal temperature of said self-regulating thermistor is between about 1° C. and 40° C. greater than said melting temperature.

3. The method of claim 1, wherein the bonding medium is a temperature-curing adhesive material having an optimum curing temperature, and said nominal temperature of said self-regulating thermistor is about equal to said optimum curing temperature.

4. The method of claim 1, wherein the bonding medium is thermoplastic material having a melting temperature, and said nominal temperature of said self-regulating thermistor is between about 1° C. and 40° C. greater than said melting temperature.

5. The method of claim 1, wherein said self-regulating thermistor is attached to the substrate and the component is bonded to said self-regulating thermistor by the bonding medium.

6. The method of claim 1, wherein the substrate has an underside and an opposite upper side, and said self-regulating thermistor is attached to the substrate on the underside thereof and the component is bonded to the substrate on the upper side thereof by the bonding medium.

7. The method of claim 1, wherein the component is bonded to the substrate by the bonding medium, and said self-regulating thermistor is arranged on the component.

8. The method of claim 1, wherein the component is bonded to the substrate by the bonding medium, and said self-regulating thermistor is arranged adjacent the component.

9. A method for bonding a plurality of components to a substrate comprising the steps of:
   (a) providing a bonding medium for bonding the component;
   (b) heating the bonding medium using a self-regulating thermistor, said self-regulating thermistor being one of a PTC-thermistor and an NTC-thermistor;
   (c) if said self-regulating thermistor is a PTC-thermistor applying an essentially constant electrical potential to said PTC thermistor during said heating of the bonding medium; and
   (d) if heating of the bonding medium is effected by an NTC-thermistor, said NTC-thermistor is supplied with an essentially constant electrical current during said heating of the bonding medium.

10. A method for bonding a component to a substrate comprising the steps of:
   (a) providing a bonding medium for bonding the component;
   (b) heating the bonding medium using a plurality of self-regulating thermistors arranged on the substrate surrounding the component, each of said self regulating thermistors being one of a PTC-thermistor and an NTC-thermistor;
   (c) if a said self-regulating thermistor is a PTC-thermistor, applying an essentially constant electrical potential thereto during said heating of the bonding medium; and
   (d) if a said self-regulating thermistor is an NTC-thermistor, supplying that NTC-thermistor with an essentially constant electrical current during said heating of the bonding medium.

11. A method for bonding a component to a substrate via a bonding medium, comprising the steps of:
   (a) providing a PTC-thermistor for heating the bonding medium during bonding of the component, said PTC-thermistor having a nominal operating temperature; and
   (b) applying an essentially constant electrical potential to said PTC-thermistor during bonding of the component thereby maintaining the temperature of said PTC-thermistor at about said nominal operating temperature during heating of the bonding medium.

12. A method for bonding a component to a substrate via a bonding medium, comprising the steps of:
   (a) providing an NTC-thermistor for heating the bonding medium during bonding of the component, said NTC-thermistor having a nominal operating temperature; and
   (b) supplying said NTC-thermistor with an essentially constant electrical current during bonding of the component, thereby maintaining the temperature of said NTC-thermistor at about said nominal operating temperature during heating of the bonding medium.

* * * * *